United States Patent [19]

Wong

[11] Patent Number: 4,813,017

[45] Date of Patent: Mar. 14, 1989

[54] SEMICONDUCTOR MEMORY DEVICE AND ARRAY

[75] Inventor: Robert C. Wong, Poughkeepsie, N.Y.

[73] Assignee: International Business Machines Corportion, Armonk, N.Y.

[21] Appl. No.: 791,941

[22] Filed: Oct. 28, 1985

[51] Int. Cl.[4] .............................................. G11C 11/40
[52] U.S. Cl. ...................................... 365/156; 357/45
[58] Field of Search .............................. 357/41, 45, 50; 365/156, 154, 155, 174, 187, 188, 177, 179, 180, 181, 182, 183

[56] References Cited

U.S. PATENT DOCUMENTS

| | | | |
|---|---|---|---|
| 3,801,967 | 4/1974 | Berger et al. | 340/173 |
| 3,986,178 | 10/1976 | McElroy et al. | 340/173 |
| 4,032,902 | 6/1977 | Herndon | 340/173 |
| 4,056,810 | 11/1977 | Hart et al. | 365/205 |
| 4,112,511 | 9/1978 | Heald | 365/188 |
| 4,144,586 | 3/1979 | Rangoon | 365/156 |
| 4,158,237 | 6/1979 | Wiedmann | 357/45 X |
| 4,228,525 | 10/1980 | Kawarada et al. | 365/174 |
| 4,292,675 | 9/1981 | Denis | 365/156 |
| 4,302,823 | 11/1981 | Gersbach et al. | 365/190 |
| 4,322,820 | 3/1982 | Toyoda | 365/154 |
| 4,366,554 | 12/1982 | Aoki et al. | 365/155 |
| 4,373,195 | 2/1983 | Toyoda et al. | 365/154 |
| 4,374,431 | 2/1983 | Ono | 365/174 |
| 4,375,645 | 3/1983 | Funatsu | 357/50 |
| 4,419,745 | 12/1983 | Toyoda et al. | 365/174 |

FOREIGN PATENT DOCUMENTS 0065999  5/1981  Fed. Rep. of Germany.

OTHER PUBLICATIONS

D. D. Howard et al, "Bipolar Memory Cell with Polysilicon-Metal Cross-Coupling," IBM Tech. Disc. Bull., vol. 23, No. 7A, Dec. 1980.

A. Schmitt, "MTL/I²L Storage Cell," IBM Tech. Disc. Bulletin, vol. 23 No. 8, Jan. 1981.

S. K. Wiedmann et al, "Injection-coupled Logic Leads Bipolar RAMS to VLSI", Electronics, Feb. 23, 1984.

R. Cullet et al, "Harper PNP Cell Layout with Improved PNP Characteristics," IBM Tech. Disc., vol. 26, No. 2, Jul. 1983.

R. C. Wong, "Hybrid Memory Cell for Two-port RAMS," IBM Tech. Disc. Bull., vol. 26, No. 10B, Mar. 1984.

R. C. Wong, "I²L Cell with Multiple Top Collectors (Emitters of Inversely Operated NPNs)," IBM Tech. Disc. Bull., vol. 27, No. 3, Aug. 1984.

R. Berger et al, "Monolithically Intergated Storage Arrangement with I²L Storage Cells," IBM Tech. Disc. Bull., vol. 27 No. 6, Nov. 1984.

S. K. Wiedmann, "Multi-Access Memory Cell," IBM Tech. Disc. Bulletin, vol. 27 No. 6, Nov. 1984.

S. K. Wiedmann et al, "High-Speed Split-emitter I²L/MTL Memory Cell," IEEE Journal of Solid State Acts., vol. sc-16 No. 5, Oct. 1981.

H. H. Berger "Monolithically Integrated Flip-Flop Control Circuit," IBM Tech. Disc. Bull., vol. 16 No. 2, Jul. 1973.

Primary Examiner—Nelson Moskowitz
Assistant Examiner—John B. Sotomayor
Attorney, Agent, or Firm—Peter L. Michaelson

[57] ABSTRACT

A memory array fabricated on a silicon substrate consists of memory cells each having two lateral p-n-p load-injector transistors and two vertical n-p-n flip-flop transistors with the p-n-p's being formed in a portion of the substrate which is electrically isolated from portions of the substrate in which the n-p-n's are formed. The layout of this cell, which is about as compact as a standard IIL memory cell, resulsts in the bases of the p-n-p's being electrically isolated from the emitters of the n-p-n's. This allows the p-n-p's to be operated in a linear region during critical operating times and thus limits stability problems associated with Ill memory cells while providing faster access times and a better tradeoff between read out currents and power dissipation.

21 Claims, 7 Drawing Sheets

SEMICONDUCTOR MEMORY DEVICE AND ARRAY

FIELD OF INVENTION

This invention relates to merged transistor memory cells and arrays and, in particular, to high density semiconductor arrays of memory cells.

BACKGROUND OF INVENTION

One standard Integrated Injection Logic (IIL) memory cell, which is described as prior art in U.S. Pat. No. 4,158,237 and has a common assignee, can be implemented in a relatively small area of silicon, has relatively low power dissipation, and has speed that is acceptable in many applications. Accordingly, this memory cell has become a basic component of high density bipolar silicon memory arrays which are fabricated on a single semiconductor substrate.

The standard IIL memory cell includes a flip-flop circuit comprising two vertical n-p-n transistors with the base of each connected to the collector of the other, and two load-injectors comprising lateral p-n-p transistors with the collector of each being connected to the collector on a separate one of the n-p-n transistors. The emitters of the p-n-p transistors are coupled to first and second bit lines, respectively. A word line is coupled to the bases of the p-n-p transistors. The p-type collector region of one p-n-p transistor also serves as the p-type base of one n-p-n transistor and the n-type bases of the p-n-p transistors and the n-type emitters of the n-p-n transistors are one common region.

The standard IIL memory cell has been found to have a number of problems. Stability, the ability to retain stored information, is one problem. An alpha particle hitting the memory cell can cause the base of the conducting transistor of the flip-flop to quickly drop in potential and thereby cause the other flip-flop transistor to start conducting. This causes a loss of correct stored information. The p-n-p transistor which supplies base current to the flip-flop transistor that is supposed to be conducting is unable to rapidly supply additional base current. This is because it is operating in saturation and as such is a relatively slow responding current source which is not capable of timely restoring the alpha particle caused lost potential. The physical structure of the memory cell dictates the electrical configuration which causes the p-n-p transistor to operate in saturation. Because the emitters of the n-p-n transistors are physically the same semiconductor region as the bases of the p-n-p's, the p-n-p's are forced to selectively operate in saturation during times at which one or the other is needed to act as a fast responding current source to prevent an alpha particle from causing a loss of correct stored information.

One possible solution to this alpha particle caused stability problem is to increase the forward current gain (beta) of the p-n-p transistors so as to enhance response time such that they act as faster responding current sources. This also improves memory access time. One disadvantage of increasing the forward current gain is that it also typically increases the reverse current gain and thereby increases leakage (back injection) into the bit lines through the saturated p-n-p transistors. This can become a serious problem when there is a large array of memory cells with most storing one bit of information and only one or just a few cells storing the opposite bit of information. The leakage onto a bit line causes that bit line to rise in potential which can result in information stored in some cells being lost. Accordingly, increasing the beta of the p-n-p's can cause additional stability problems.

The operation of a standard IIL memory cell of an array of cells is quasi static in that when a cell of a selected row of the array is accessed the cells of all other rows have no dc current flow. These other cells retain the stored information as the potentials on the parasitic capacitance associated with the collectors of the n-p-n transistors. The time period during access (the read out of information or the writing in of information) must be limited or some of the nonaccessed memory cells may lose the stored information. There is essentially always some loss of the potential on the collectors of the non-accessed row n-p-n transistors and, therefore, a standby operation is required between subsequent accesses. The standby operation essentially resets the diminished potentials to their full levels and re-establishes a relatively low dc current flow through all memory cells. During standby operation the memory cells are particularly susceptible to a loss of current stored information if hit by an alpha particle because the low current level is relatively easily cut off.

Still another problem of the standard IIL memory cell is that a relatively poor trade off between obtaining larger readout currents and increasing power dissipation exists because a p-n-p transistor operating in saturation tends to have a decreasing forward beta with increasing current flow.

Still another problem with standard IIL memory cells is that back injection through one of the p-n-p's of each cell of a column of cells onto a bit line causes a bit line offset (voltage change). Only a limited change in one bit line voltage versus another bit line voltage can be tolerated before correct stored information is lost. Accordingly, the number of cells per column must be limited to maintain reasonable stability. The bit line offset also causes access time to be increased.

Still another problem of the standard IIL memory cell is that access time is slowed during a read operation because initially the bit lines see essentially equal current flow becuase the emitter-base junctions of both p-n-p's are conducting equally. Not until one of the p-n-p's starts conducting large collector-emitter current is a differential current signal developed on the bit line.

U.S. Pat. No. 4,158,237 teaches and claims an improved storage cell which contains two standard IIL structures which are formed in a single semiconductor body and are electrically isolated from each other. Each IIL structure consists of a lateral p-n-p transistor merged with a vertical n-p-n transistor with the n type base of the p-n-p transistor also serving as the n type emitter of the n-p-n transistor. This allows the emitters of the n-p-n transistors to be split apart and to be coupled to right and left bit lines. The base of each of the load-injector transistors is still coupled to one of the emitters of the n-p-n transistors. This improved cell does provide a strong read out signal at high speeds with a minimum of addressing lines, but still has the stability problems associated with the standard IIL memory cell. The reason for the stability problem is that the p-n-p transistors are forced to operate in saturation during critical operating times because of the common n-type region used for the base of the p-n-p and the emitter of the n-p-n.

It is desirable in many applications to have a bipolar memory cell which is of suitable physical size for use in high density memory arrays and which has better stability and a better tradeoff between readout current and power dissipation than the standard IIL memory cell. Additionally, it is desirable in some applications to have significantly less bit line offset and faster access than the standard IIL memory cell.

SUMMARY OF INVENTION

The present invention is directed to a mxn memory array formed in a semiconductor substrate (body) comprising memory cells which each comprise first (T1) and second (T2) bipolar transistors of a first conductivity type, typically lateral p-n-p's, and third (T3) and fourth (T4) bipolar transistors of the opposite conductivity type, typically vertical n-p-n's. The collectors of T1 and T3 are coupled together to the base of T4. The collectors of T2 and T4 are coupled together to the base of T3. The array contains m rows and n column of memory cells with one separate wordline of m wordlines being associated with each row and one separate pair of bit lines of n pairs of bit lines being associated with each column. T1 and T2 of each memory cell are formed in one of m first portions of the semiconductor substrate. T3 is formed in one of mxn second portions of the semiconductor body and T4 is formed in one of mxn third portions of the semiconductor body. The array is characterized in that the first portions are electrically isolated from the second and third portions.

The structure of the memory cell of the present invention is such that T1 and T2 can be operated in a linear region during critical operating times when an alpha particle impacting a memory cell can cause a loss of potential which results in a loss of the stored information. With T1 and/or T2 operating in a linear range, one or both can act as fast responding current sources which quickly overcome the adverse effects of an alpha particle hit on a memory cell.

In one illustrative embodiment the emitters of T3 and T4 are coupled to a left bit line BLL and a right bit line BLR of the pair of bit lines associated with a column of memory cells. The bases of T1 and T2 are coupled together to one of the m word lines WL's and one of n source lines SL's is coupled to the emitters of T1 and T2. The n-p-n transistors are vertical polysilicon base type bipolar transistors with the collector being on a major surface of the semiconductor substrate and conductive polysilicon layers connecting the bases of the n-p-n's to the collectors of the p-n-p's. This memory cell is almost as as small as a standard IIL memory cell and has better stability, faster access time, and a better trade off between larger read out current and power dissipation.

In another illustrative embodiment the emitters of T3 and T4 are coupled together and the emitters of T1 and T2 are coupled to a left bit line BLL and a right bit line BLR, respectively. The bases of T1 and T2 are coupled together to one of the m WL's. The second and third regions of the semiconductor body are merged together. This memory cell is compact, essentially only slightly larger than a standard IIL memory cell, and has better stability, faster access time, a better trade off between larger read out current and power dissipation, and does not have the bit line offset problem of the IIL memory cell.

In another illustrative embodiment the memory cell comprises fifth and sixth transistors of the first conductivity type which are typically lateral p-n-p transistors. The bases of T1 and T2 are coupled together to one of the m WL's and the emitters of T1 and T2 are coupled together and coupled to one of n source lines SL's. The emitters of T5 and T6 are coupled to BLL and BLR of the pair of bit lines associated with a column of memory cells. This memory cell, though not as compact as the standard IIL memory cell, has better stability, no bit line offset problem, faster access time, and a better trade off between larger read out current and power dissipation.

These and other novel features and advantages of the present invention are better understood from consideration of the following detailed description taken in conjunction with the accompanying drawings.

DETAILED DESCRIPTION

Figure 1:
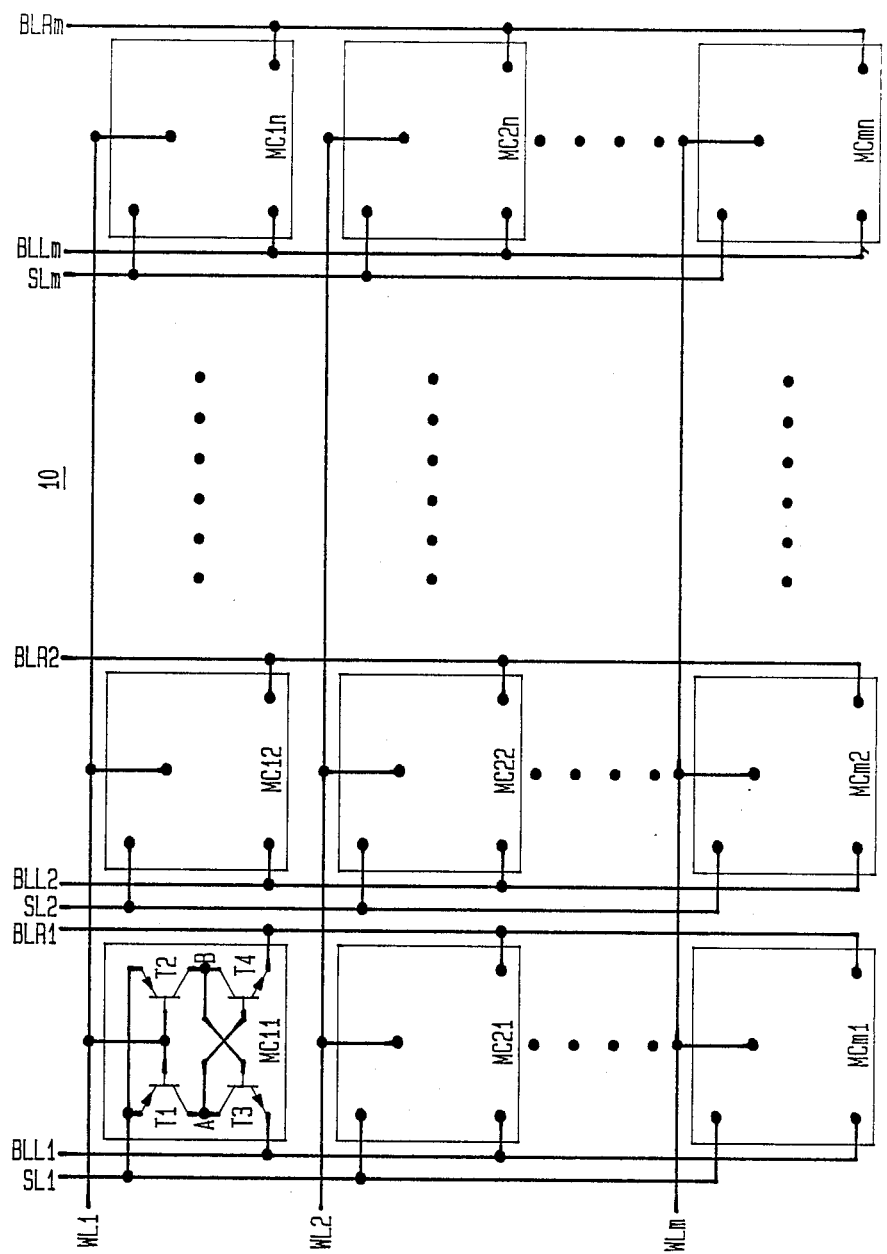
FIG 1 illustrates a memory array in accordance with one embodiment of the present invention.

Referring now to FIG. 1, there is illustrated a semiconductor memory array 10 which comprises memory cells MC arranged in m rows by n columns where m and n are positive intergers. The numbers following the MC's indicate the location of each memory cell in the array. For example, MC11 represents a memory cell which is in the first row and in the first column; MCmn represents a memory cell which is in the mth row and nth column. The array comprises m pairs of bit lines BL's. Each column of the n columns of memory cells has a separate pair of bit lines BL's associated therewith. The bit line to the left of a MC is BLL and the bit line to the right of a MC is BLR. The number following a BLL or a BLR indicates which column the BL's are associated with. For example, the first column of memory cells, MC11, MC21, ..., MCm1, has associated therewith bit lines BLL1 and BLR1; the nth column of memory cells, MC1n, MC2n, ..., MCmn, has associated therewith bit lines BLLn and BLRn. The array comprises m source lines SL1, SL2, ..., SLm, with one separate select line being associated with each column of MC's. For example, SL2 is associated with the second column of memory cells which comprises MC12, MC22, . . . , MCm2. The array further comprises m word lines WL1, WL2, . . . , WLM with a separate word line being associated with each row of MC's. For example, WL2 is associated with the second row of memory cells which comprise MC21, MC22, . . . , MC2m. Array 10 is useful as a high density random access quasi static memory.

Figure 2:
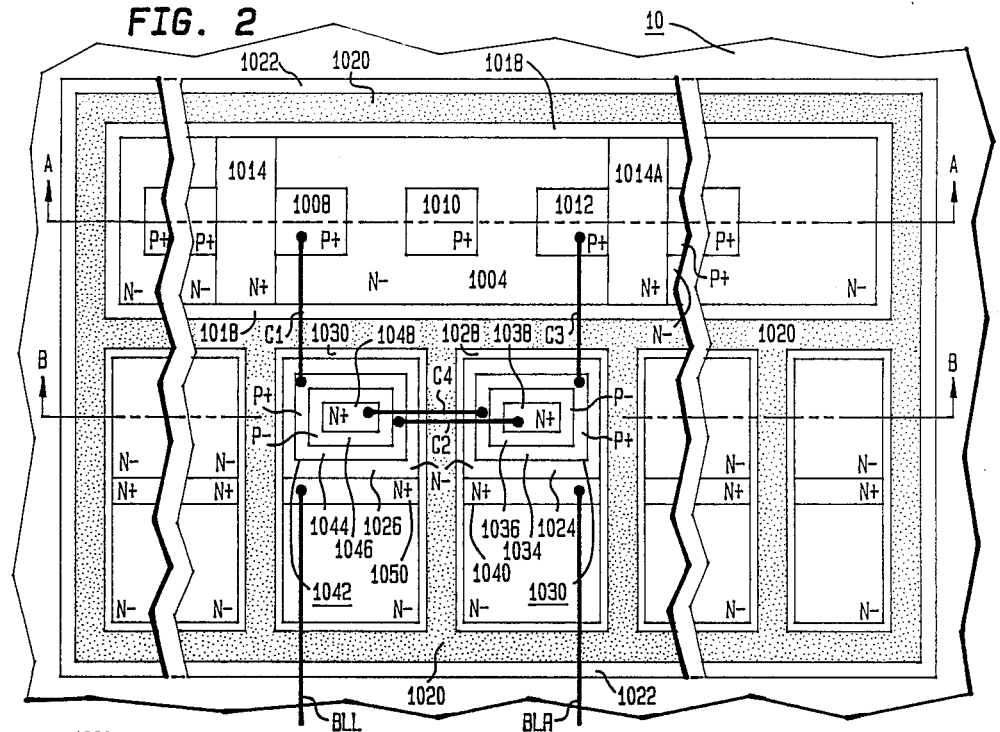
FIG. 2 illustrates a top view of a semiconductor embodiment of the memory array of FIG. 1.
Figure 3:
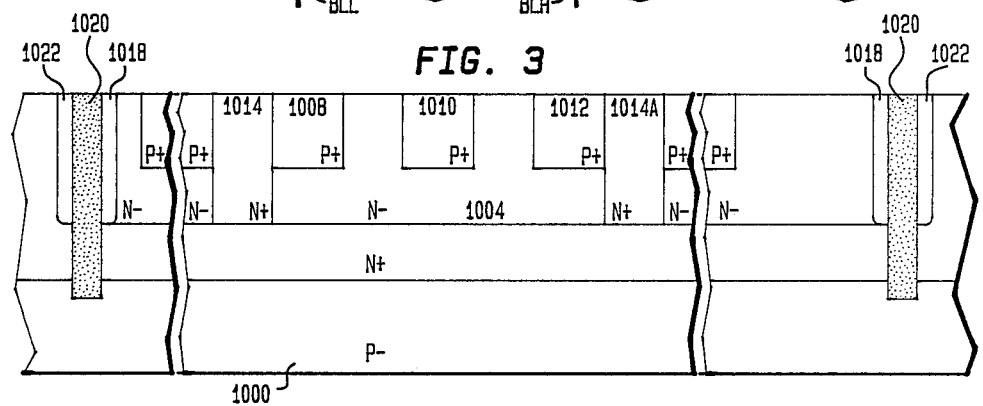
FIG. 3 illustrates a cross-sectional view along line A—A of FIG. 2.
Figure 4:
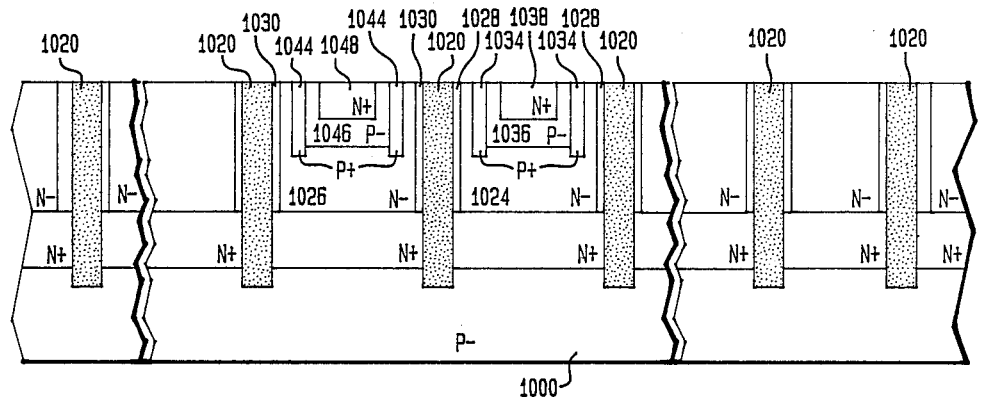
FIG. 4 illustrates a cross-sectional view along line B—B of FIG. 2.

Each MC comprises two bipolar transistors of one conductivity type and two bipolar transistors of the opposite conductivity type. In one illustrative example, the transistors of the one conductivity type are assumed to be lateral p-n-p transistors T1 and T2 and the transistors of the opposite conductivity type are vertical n-p-n transistors T3 and T4. The structures of all of the MC's are identical to that illustrated for MC11. FIG. 2 illustrates a top view of a MC of a semiconductor embodiment of part of array 10 fabricated on a single silicon substrate (body). FIGS. 3 and 4 illustrate cross-sectional views of memory array 10 along lines A—A and B—B, respectively, of FIG. 2.

In each MC the collector of T1 is coupled to the collector of T3, to the base of T4 and to a node A. The collector of T2 is coupled to the collector of T4, to the base of T3, and to a node B. The emitters of T1 and T2 are coupled together to a word line WL. The emitters of T3 and T4 are coupled to bit lines BLL and BLR, respectively. T3 and T4 have cross-coupled bases and act essentially as a flip-flop. T1 and T2 act as load elements for T3 and T4, respectively, and as sources of base current for T4 and T3, respectively. Typically current flows through T1 and T3 with base current to support conduction through T3 being supplied by T2, or flows through T2 and T4 with base current to support conduction through T4 being supplied by T1. The cell is defined as storing "1" if there is current flow through T1 and T3 and as storing a "0" if there is current flow through T2 and T4.

A cycle of operation starts with a standby portion which is followed by an access (read or write) portion which is, in turn, followed by a standby portion. In standby, WL is typically at 1.0 volt and SL is at 1.6 volts. BLL and BLR are both at approximately 0.2 volts. Assuming the cell stores a "1", then there is current flow through T1 and T3 with T2 acting as a source of base current for T3. There is a 0.6 volt forward bias across the emitter-base junctions of T1 and T2 and, accordingly, there is enough forward bias across these junctions to allow low level conduction through T1 and T2. Terminal B is at approximately +0.82 volts and terminal A is at approximately +0.22 volts. T3 is conducting and operating in saturation since its collector, which is at +0.82 volts, is forward biased by 0.60 with respect to its base, which is at +0.22 volts. T1 and T2 are conducting in a linear region since both collector-base junctions are reversed biased.

During standby the amount of current being drawn by a cell is relatively low and can be cut off relatively easily. The forward current gain (beta) of T3 or T4 when they are operating in saturation is typically not much above unity. Accordingly, less than flowing through the MC but close to half of the current flows through T2 when the cell stores a "1". An alpha particle hitting terminal B causes the generation of electron-hole pairs which decrease the potential of terminal B from +0.82 towards the 0.2 volts on BLL. This has the effect of quickly and significantly reducing the forward bias across the emitter-base junction of T3. This could thus result in no conduction through T3 and T4 for some short period of time. T2, which is operating in a linear region, acts as a fast responding current source which quickly re-establishes the potential of terminal A if an alpha particle hits node A so as to prevent T3 from turning off. Accordingly, the memory cell has relatively good stability with respect to alpha particles. If during standby T2 were to operate in saturation, as is the case with the load-injector p-n-p's of standard IIL memory cells, it would be a relatively slow responding current source which may not always act quickly enough to keep T3 conducting and thus save the correct stored information in the memory cell.

The standard IIL memory cell, which is discussed in the Background of the Invention hereinabove, achieves its modest size by merging a lateral p-n-p transistor with a vertical n-p-n transistor through the use of a common n-type region for the bases of the p-n-p's and the emitters of the n-p-n's. This forces the equivalent T2 p-n-p transistor to operate in saturation during standby and thereby creates stability problems. This memory cell of the present invention can be fabricated in approximately the same area of silicon as the standard IIL memory cell but does not couple the bases of the p-n-p's to the emitters of the n-p-n's and thus allows the p-n-p's to operate in a linear region during standby which improves stability.

One or up to all of the MC's of a given row of MC's can be accessed (read or written) at the same time. Assume first that only one MC is to be read. The SL and WL of this cell are changed in potential to +1.1 volts and +0.3 volts, respectively. All other SL's and WL's are set to +0.9 volts and +1.0 volts, respectively. The same basic conditions as existed during standby still exist except that the emitter-base junctions of T1 and T2 are heavily forward biased (+0.8 volts) whereas same were just lightly forward biased (+0.6 volts) during standby. This results in substantially greater current flow through T1 and T3 and substantially more base current through T2 to support conduction through T3. The current flow through T3 is sensed and compared to the current flow through T4, which is essentially 0 since T4 is off. Since the current flow in BLL is much greater than in BLR, the cell is determined to store a "1". If the reverse is true, the cell stores a "0".

All other MC's of the selected WL have the same forward bias across the emitter-base junctions of T1 and T2 as they had during standby and essentially act as they did during standby. There are current differences in the corresponding BL's, but same are not sensed. Since all WL's other than the selected WL stay at +1.0 volts and the SL's are at 1.1 or 0.9 volts, the emitter-base junctions of the T1's and T2's of these MC's are not sufficiently forward biased to allow conduction therethrough. Accordingly, there is no conduction in the T3's and T4's of these MC's. The potentials of the A and B terminals of each of the MC's not associated with the selected WL are held by parasitic capacitances (not illustrated) associated with these terminals. These potentials decay with time. If the access portion of the operating cycle is kept relatively short, then these potentials will stay close enough to the values set during standby such that when standby is again achieved all the stored information will be correct and the potentials of nodes A and B are fully restored. This is the reason that this memory array is said to be quasi static.

If it is desired to write into a cell rather than read out, then the standby operation is followed by a write operation in which the WL and SL corresponding to the selected MC are set in potential to 0.2 volts and 1.1 volts, respectively. To write a "0" in an MC which presently contains a "1", BLL is pulsed from 0.2 volts to 0.6 volts and BLR is left at 0.2 volts. All nonselected SL's, WL's, BLL's, and BLR's are held at 0.9 volts, 1.0 volt, 0.2 volts, and 0.2 volts, respectively. This reduces the forward bias across the emitter-base junction of T3 of the selected MC to a point at which T3 ceases to conduct. The increase in potential at the emitter of T3 (BLL) is capacitively coupled via the parasitic emitter-base capacitance (not illustrated) to node B. This increases the collector base potential of T2 until T2 is forced to begin to operate in saturation. As T4 begins to conduct current, the potential of node B drops to close to 0.2 volts and T2 now operates in the linear region since its collector-base junction is reversed biased. T4 is now conducting and the cell, which had stored a "1", now stores a "0". This causes nonselected MC's coupled to the selected WL to be in standby while all MC's of nonselected WL's and SL's are biased off and retain stored information as the potentials of terminals A and B as is the case during a read operation. A write operation must, therefore, be followed by a standby operation in order to fully restore correct information to all the MC's.

The memory array 10 of FIG. 1 can be made fully static by rotating the select lines SL's by 90 degrees such that same are parallel to the word lines WL's. There are now needed m SL's instead of the n SL's previously needed. These horizontal SL's (not illustrated) are coupled to the emitters of T1 and T2 of each MC of a common row. During a standby operation this modified array acts essentially as the original. During an access operation all MC's of a selected WL and SL are activated and all other MC's are operating as would occur during normal standby operation. Thus with horizontal SL's, array 10 becomes fully static and there is essentially no need for a standby operation. Access times may be as long as desired. There are disadvantages incurred with horizontal SL's. During access the nonselected MC's are still on (even if at low current levels) and therefore there can be some charge injected into the bit lines which causes delay before an output signal on a bit line can be sensed. Additionally, the overall array layout is somewhat more complex and therefore it is expected its size will be greater than with vertical SL's. Still further, there may be current hogging by some of the emitter-base junctions of the T1's and T2's of the memory cells of the activated (accessed) row.

Referring now to FIGS. 2, 3, and 4, there is llustrated a top view, a first cross-sectional view through lines A—A of FIG. 2, and a second cross-sectional view through lines B—B of FIG. 2 of a portion of the memory array 10 of FIG. 1 which includes one memory cell and parts of other memory cells. Each semiconductor region is denoted as to whether it is of p or n type conductivity. Array 10 is illustrated as being fabricated starting with a p— type silicon substrate 1000 on top of which there is an n+ type layer over which is an epitaxial n— type layer. Isolated portions of the n+ type layer and the n— type epitaxial layer are used to form portions of the transistors of a MC.

A portion of the n— type epitaxial layer, denoted as region 1004, contains lateral p-n-p transistors T1 and T2. Each semiconductor region is denoted as to whether it is p or n type. Region 1004 serves as the n— type bases of both T1 and T2. Spaced apart from each other by n— type portions of region 1004 are p+ type regions 1008, 1010, and 1012. Regions 1008 and 1012 serve as the collector regions of T1 and T2, respectively. Region 1010 serves as a common emitter region for T1 and T2. Regions 1014 and 1014A are n+ type regions which can serve as a low resistance contact regions for region 1004 which serves as the base regions of T1 and T2. Regions 1014 and 1014A also serve to limit the formation of parasitic lateral transistors with T1's and T2's to the right and left of the T1 and T2 illustrated. These other T1's and T2's are part of memory cells of a common row with the memory cell illustrated. Region 1004 extends across substrate 1000 and contains all of the T1's and T2's of a common row of memory cells. Each row of memory cells is formed in a separate one of m region 1004's. Region 1004 is isolated from other regions by silicon dioxide region 1018 and by then by a trench 1020 which both circle around region 1004. Another silicon dioxide region 1022 surrounds the other side of trench 1020. Trench 1020 extends down into substrate 1000. Silicon dioxide regions 1018 and 1022 extend down to and touch a portion of the n+ type layer.

Another portion of the n— type epitaxial layer is illustrated as region 1024 which contains transistor T3 of one memory cell of one row of cells and a second transistor T3 (not illustrated) of a memory cell of an adjacent row of memory cells. A silicon dioxide region 1028 surrounds region 1024 and extends down to the n+ type layer. Trench 1020 surrounds silicon dioxide region 1028 which surrounds region 1024 and extends down to substrate 1000.

Within n— type region 1024, which serves as the emitters of the two T3 transistors, exists a p-type base region 1030, which is the base of one of the T3's and which comprises p type intrinsic base region 1036 and p+ type extrinsic base region 1034. Within p type region 1036 exists n+ type region 1038 which serves as the collector of one of the T3's. An n+ type region 1040 extends down to the n+ type layer and serves as the emitter contact for the two T3's. This type of vertical n-p-n bipolar transistor is generally denoted as a vertical n-p-n polysilicon base transistor. In conventional vertical n-p-n transistors the bottom n-type region is the collector and the top n-type region is the emitter. Here the top n-type region is the collector and the bottom n-type region is the emitter. This type of structure is typically denoted as an "inverted" transistor. It is used, even though it has lower current gain than a conventional vertical n-p-n, because an alpha particle hitting T3 or T4 typically generally penetrates into the n— type epitaxial layer before many electron-holes are generated. If this region is the emitter, the possibility of a loss of charge on the A and B nodes is less than if it is the collector which is coupled directly to node A or node B.

Another portion of the n— type epitaxial layer is illustrated as region 1026 which contains transistor T4 of one memory cell and transistor T4 (not illustrated) of a memory cell of an adjacent row of memory cells. A silicon dioxide region 1030 surrounds region 1026 and extends down to a portion of the n+ type layer. Trench 1020 surrounds silicon dioxide region 1030. Silicon dioxide layer 1022 surrounds trench 1020. Trench 1020 is typically covered with a thin wall of dielectric and is filled with p+ type doped polysilicon or polyimide.

Within n— type region 1026, which serves as the emitters of the two T4's, exists a p type base region 1042, which is the base of one of the T4's and which comprises p type intrinsic base region 1046 and p+ type extrinsic base region 1044. Within region 1046 exists n+ type region 1048 which serves as the collector of one of the T4's. An n+ type region 1050 extends down to the n+ type layer and serves as the emitter for the two T4's. The type of vertical transistor is essentially indentical to T3 and is also denoted as a vertical n-p-n polysilicon base transistor. Bit lines BLL and BLR are coupled to region 1050 (the emitter of T4) and to region 1040 (the emitter of T3), respectively.

A first electrical connection C1 couples region 1008 (the collector of T1) to region 1044 (the extrinsic base of T4) and a second electrical connection C2 couples region 1044 (the extrinsic base of T4) to region 1038 (the collector of T3). A third electrical connection C3 couples region 1012 (the collector of T2) to region 1034 (the extrinsic base of T3). A fourth electrical connection C4 couples region 1034 (the extrinsic base of T4) to region 1048 (the collector of T4). C1 and C3 are preferably p+ type conductive polysilicon and C2 and C4 are preferably a conductive metal.

Vertical n-p-n transistors of the polysilicon base type can be used with the emitter being on the top and the collectors being below because T1 and T2 operate during standby in a linear region. This enhances access time becuase the emitter on top vertical n-p-n transistor has a higher forward current gain (beta).

Figure 5:
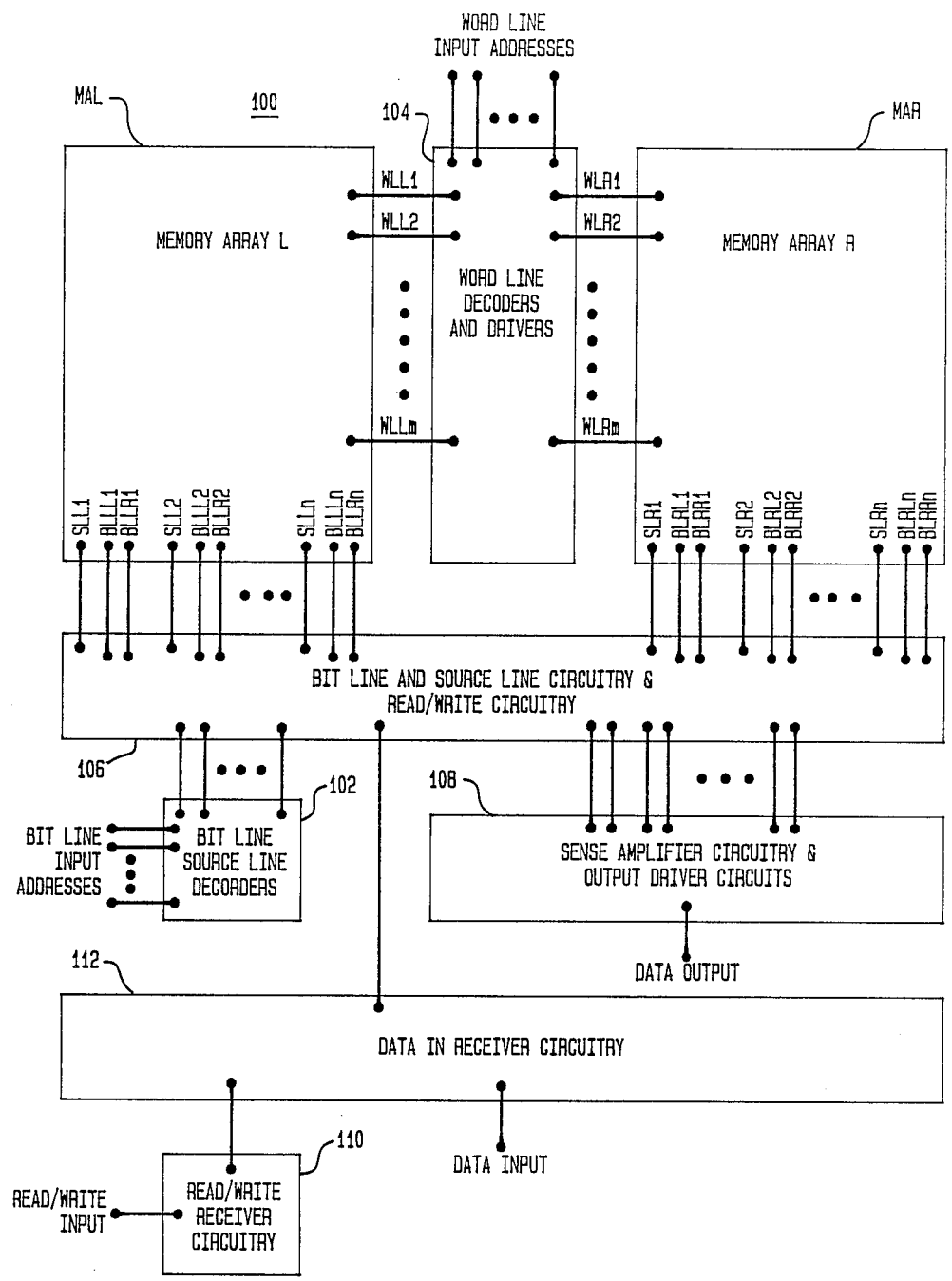
FIG. 5 illustrates a memory system using the memory array of FIG. 1.

Referring now to FIG. 5, there is illustrated a memory system 100 which comprises a memory array left MAL, a memory array right MAR, bit line and source line decoders 102, word line decoders and drivers 104, bit line and source line circuitry and read/write circuitry 106, sense amplifier circuitry and output driver circuits 108, read/write receiver circuitry 110, and data in receiver circuitry 112. MAL and MAR are essentially identical with each having the configuration of array 10 of FIG. 1. MAL and MAR together form an m word by 2n bit memory array which comprises 2mxn memory cells arranged in m rows by 2n columns. One reason MAL and MAR are used is to allow lower capacitive loading of the word lines so as to improve access time. The decoders, circuitry and circuits of memory system 100 are adapted to supply the potential levels and currents needed to operate the memory array of FIG. 10.

Input address information comes into 102 and 104 which select any desired word line of MAL and the corresponding word line of MAR and one or more pairs of bit lines, respectively, such that any memory cell or memory cells of any word line of MAL and MAR can be accessed. 102 and 104 also facilitate a standby operation. Each of MAL and MAR has two bit lines associated with each column of memory cells. MAL has bit lines BLLL1, BLLR1, BLLL2, BLLR2, . . . , BLLn, BLLRn and MAR has bit lines BLRL1, BLRR1, BLRL2, BLRR2, . . . , BLRLn, BLRRn. Each of MAL and MAR has source lines associated with each column of memory cells. MAL has select lines SLL1, SLL2, . . . , SLLn and MAR has select lines SLR1, SLR2, . . . , SLRn. All source lines and bit lines are coupled to 106.

Output terminals of 102 are coupled to input terminals of 106. Output terminals of 106 are coupled to input terminals of 108. An output terminal of 110 is coupled to an input of 112. Word line address input signals are applided to the word line input address terminals of 104. Bit line address input signals are applied to bit line input address input terminals of 102. A read/write input signal is applied to a read/write input terminal of 110. A data signal containing data which is to be entered into a memory cell is applied to a data input terminal of 112. An output terminal of 112 is coupled to an input terminal of 106.

104 decodes input word address data and is adapted to select the same one word line of both memory arrays and set the potentials thereof to a preselected value and to set the potentials of all other word lines to a second preselected value. 104 is also adapted to apply the same potential to all word lines during a standby operation. 102 is adapted to generate output signals indicative of which select lines and bit line pairs of the memory arrays are to be selected as determined by the data of the address data applied to its input terminals. 106 is adapted to be responsive to data received from 102 and to set the potentials of the source lines and bit lines to the proper values such that information can be written into or read out of any desired memory cell. 108 receives information read out of one or more selected memory cells and determines whether a "1" or a "0" is stored and sends this data the data output terminal thereof. 110 receives a read or a write signal at a read/write input terminal thereof and generates a read or a write signal at an output terminal thereof which is coupled to 112. 112 allows data which is applied to a data input terminal thereof to be coupled to 106 if a write signal is present at the input terminal thereof and does not allow a data input signal to reach 106 if a read signal is received from 112.

The decoders, circuitry and circuits of 100 are conventional and can be found available commercially as part of memory systems.

MC can be fabricated using 1.2 micron design rules in approximately 235 square microns. This is only about 4% greater area required to fabricate a standard IIL memory cell using the 1.2 micron design rules. MC is faster and more stable than the standard IIL memory cell and has a better tradeoff between increased magnitude read out currents and power dissipation. Memory system 100, with 81,920 memory cells, can be fabricated using 1.5 micron design rules in approximately 36 square millimeters.

Figure 6:
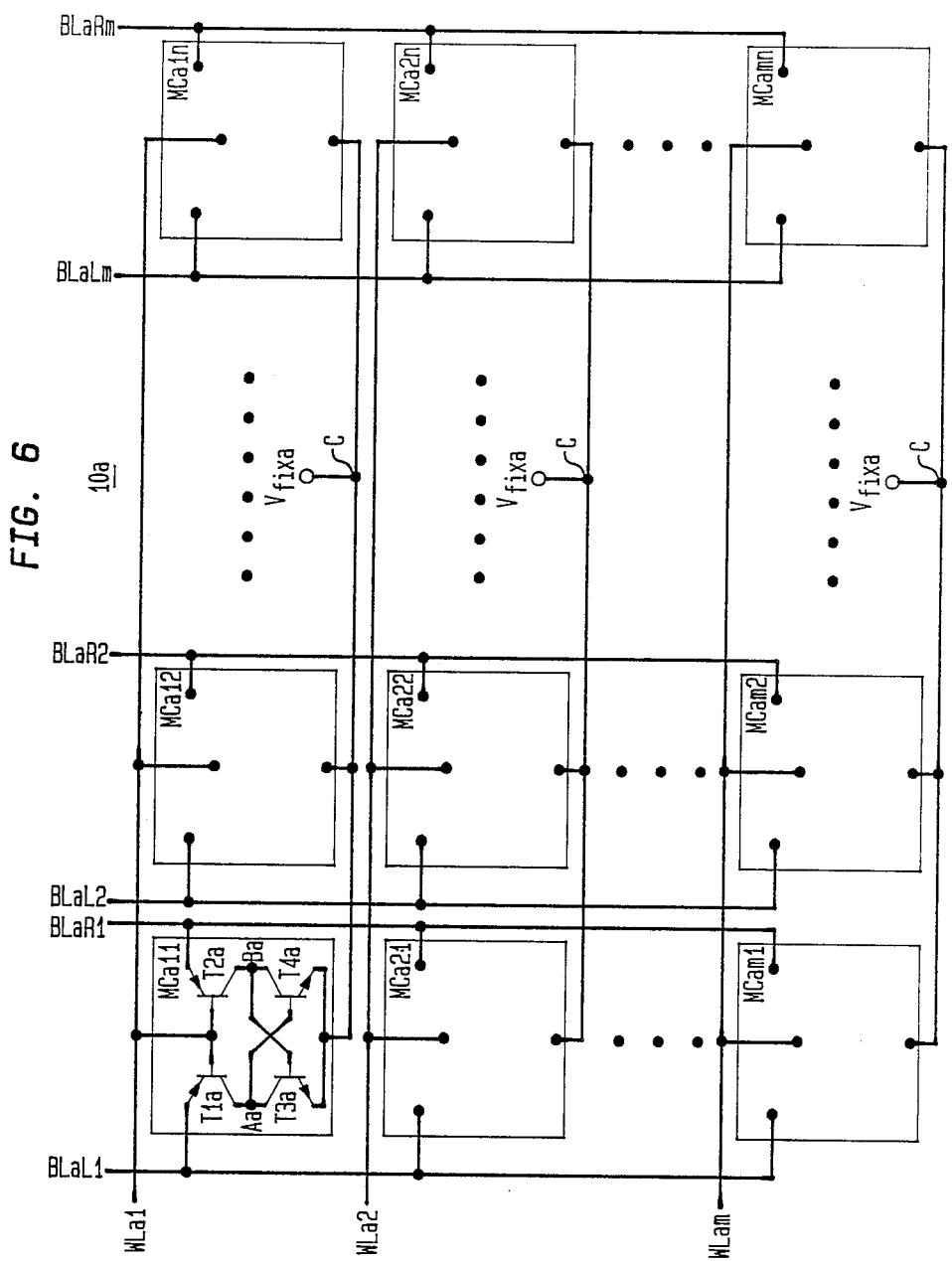
FIG. 6 illustrates a memory array in accordance with another embodiment of the present invention.

Referring now to FIG. 6, there is illustrated a semiconductor memory array 10a which comprises memory cells MCa arranged in m rows by n columns where m and n are positive intergers. The numbers following the MCa's indicate the location of each memory cell in the array. For example, MCa11 represents a memory cell which is in the first row and in the first column; MCaMN represents a memory cell which is in the mth row and nth column. The array comprises n pairs of bit lines BLa's. Each column of the n columns of memory cells has a separate pair of bit lines BLa's associated therewith. The bit line to the left of a MCa is BLaL and the bit line to the right of a MCa is BLaR. The number following a BLaL or a BLaR indicates which column the BLa's are associated with. For example,, the first column of memory cells, MCa11, MCa21, . . . , MCam1, has associated therewith bit lines BLaL1 and BLaR1; the nth column of memory cells, MCa1n, MCa2n, . . . , MCamn, has associated therewith bit lines BLaLn and BLaRn. The array further comprises m word lines WLa1, WLa2, . . . , WLaM with a separate word line being associated with each row of MCa's. For example, WLa2 is associated with the second row of memory cells which comprise MCa21, MCa22, . . . , MCa2n.

Array 10a is useful as a high density random access quasi static memory.

Figure 7:
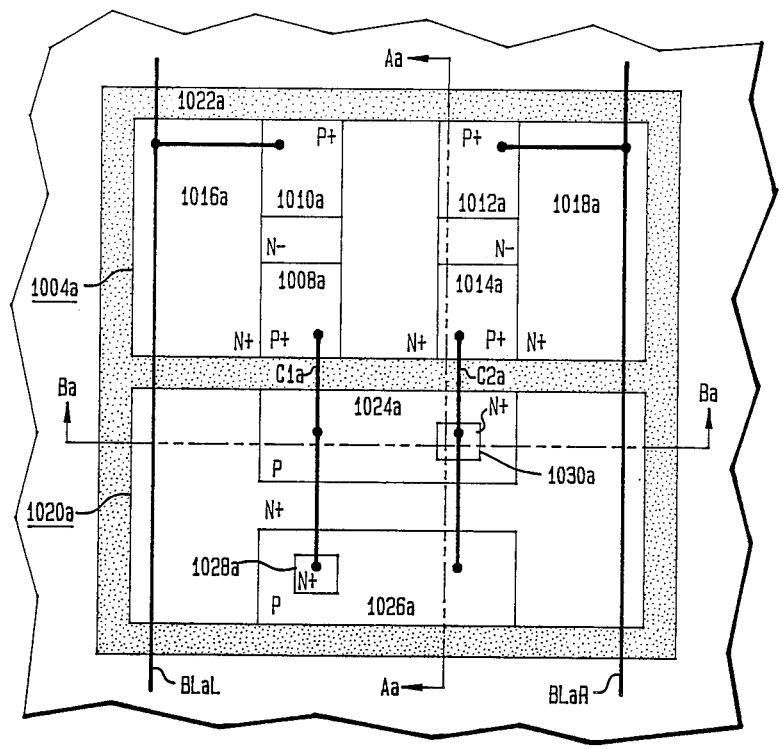
FIG. 7 illustrates a top view of a semiconductor embodiment of the memory array of FIG. 6.
Figure 8:
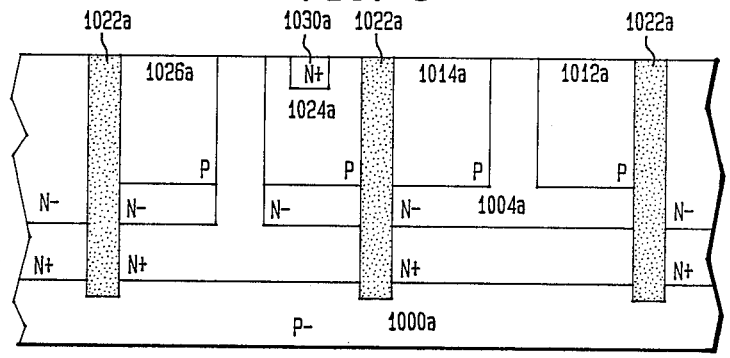
FIG. 8 illustrates a cross-sectional view along line Aa—Aa of FIG. 7.
Figure 9:
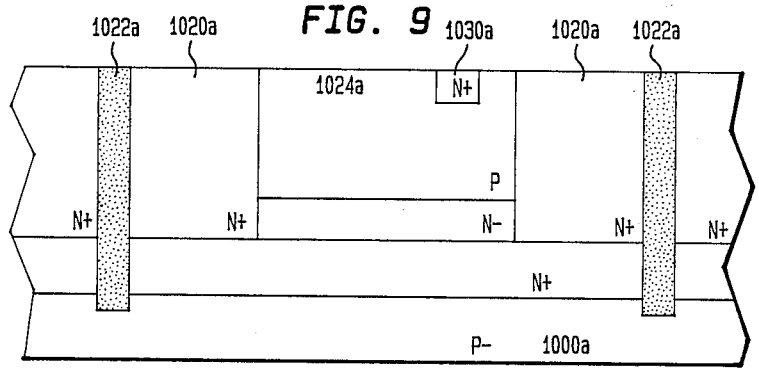
FIG. 9 illustrates a cross-sectional view along line Ba—Ba of FIG. 7.

Each MCa comprises two bipolar transistrors of one conductivity type and two bipolar transistors of the opposite conductivity type. In one illustrative example, the transistors of the one conductivity type are assumed to be lateral p-n-p transistors T1a and T2a and the transistors of the opposite conductivity type are vertical n-p-n transistors T3a and T4a. The structures of all of the MCa's are identical to that illustrated for MCa11. FIG. 7 illustrates a top view of a MCa of a semiconductor embodiment of part of array 10a fabricated on a single silicon substrate (body). FIGS. 8 and 9 illustrate cross-section views of parts of array 10a along lines Aa-Aa and Ba-Ba, respectively.

In each MCa the collector of T1a is coupled to the collector of T3a, to the base of T4a and to a node Aa. The collector of T2a is coupled to the collector of T4a, to the base of T3a, and to a node Ba. The bases of T1a and T2a are coupled together to a common word line. The emitters of T1a and T2a are coupled to bit lines BLaL and BLaR. The emitters of T3a and T4a are coupled together to a common line and to a node C which is typically coupled to a fixed voltage level Vfixa. T3a and T4a have cross-coupled bases and act essentially as a flip-flop. T1a and T2a act as load elements for T3a and T4a, respectively. Typically, current flows through T1a and T3a with base current to support conduction through T3a being supplied by T2a, or flows through T2a and T4a with base current to support conduction through T4a being supplied by T1a. The cell is defined as storing "1" if there is current flow through T1a and T3a and as storing a "0" if there is current flow through T2a and T4a.

A cycle of operation starts with a standby portion which is followed by an access (read or writ) portion which is in turn followed by a standby portion. In standby, WLa is typically at 1.0 volt. BLaL and BLaR are both at approximately 1.6 volts. Node C is held at 0.2 volts. Assuming the cell stores a "1", then there is current flow through T1a and T3a and T2a acts as a source of base current for T3a. There is a 0.6 volt forward bias across the emitter-base junction's of T1a and T2a and, accordingly, there is enough forward bias across these junctions to allow low level conduction through T1a and T2a. Terminal Ba is at approximately +0.82 volts and terminal Aa is at approximately +0.22 volts. T3a is conducting and operating in saturation since its collector, which is at +0.82 volts, is forward biased by 0.60 with respect to its base, which is at +0.22 volts. T1a and T2a are conducting in a linear region since both collector-base junctions are reversed biased.

During standby the amount of current being drawn by a cell is relatively low and can be cut off relatively easily. The forward current gain (beta) of T3a or T4a when they are operating in saturation is typically not much above unity. Accordingly, less than but close to half of the current flowing through the MCa flows through T2a when the cell stores a "1". An alpha particle hitting terminal Ba causes the generation of electron-hole pairs which decrease the potential of terminal Ba from +0.82 towards 0.2 volts. This has the effect of quickly and significantly reducing the forward bias across the emitter-base junction of T3a. This could thus result in no conduction through T3a and T4a for some short period of time. T2a, which is operating in a linear region, acts as a fast responding current source and quickly reestablishes the potential of terminal Aa so as to prevent T3a from turning off. Accordingly, the memory cell has relatively good stability with respect to alpha particles. If T2a were to operate during standby in saturation, as is the case with the load-injector p-n-p's of standard IIL memory cells, it would be a relatively slow responding current source which may not always act quickly enough to keep T3a conducting and thus save the correct stored information in the memory cell.

The standard IIL memory cell, which is discussed in the Background of the Invention hereabove, achieves its modest size by merging a lateral p-n-p transistor with a vertical n-p-n transistor through the use of a common n− type region for the bases of the p-n-p's and the emitters of the n-p-n's. This forces the equivalent T2a p-n-p transistor to operate in saturation during standby and thereby creates stability problems. This memory cell of the present invention can be fabricated in slightly more area of silicon than the standard IIL memory cell, but it does not couple the bases of the p-n-p's to the emitters of the n-p-n's and thus allows the p-n-p's to operate in a linear region during standby operation which improves stability.

One or up to all of the MCa's of a given row of MCa's can be accessed (read or written) at the same time. BLaL and BLaR and WLa of the selected MCa are changed in potential to 0.4, 0.4, and 0.2 volts, respectively. All other BLaL's, BLaR's, and WLa's are set to 0.8, 0.8, and 1.0 volts, respectively. If the MCa stores a "1", then node Ba is momentarily charged above +0.82 volts and node Aa is at approximately +0.22 volts. This means that the collector, base, and emitter of T2a are above +0.82, +0.2, and about +0.4 volts, respectively. Thus the collector-base junction of T2a is forward biased by more than +0.62 volts, while the emitter-base junction of T2a is only biased by +0.2 volts. These conditions cause current flow (positive current) from the collector of T2a to the emitter. This is the reverse direction that current normally flows through a p-n-p transistor and thus the collector and emitter have effectively reversed themselves. This current flow through T2a continues until node Ba discharges below +0.8 volts and thus the forward bias across the collector-(emitter)-base junction of T2a decreases below a forward bias of +0.6 volts. This pulse of current onto BLaR represents the read of a stored "1" in this memory cell. The potentials on the collector, base, and emitter of T1a, which are +0.22, +0.2, and +0.4, respectively, are insufficient to cause T1a to conduct in the normal or reverse direction. Accordingly, there is no current pulse on BLaL. If the cell stores a "0", then, during read out, there is a current pulse generated on BLaL and none generated on BLaR.

All nonselected MCa's of the same column as the selected MCa are biased off and maintain the stored information as the potentials of the parasitic capacitances (not illustrated) associated with nodes Aa and Ba of each. All nonselected MCa's of the same row as the selected MCa actively maintain the stored information. All nonselected MCa's not of the same row or column as the selected MCa are essentially biased off and maintain the stored information as the potentials of the parasitic capacitances associated with nodes Aa and Ba of each.

The selected WLa and all of the BLaL's and BLaR's are set to 0.2, 0.4, and 0.4 volts, respectively, in order to read all of the MCa's of a given row of MCa's. Read out occurs in each MCa of the selected row as it does for the case in which just one MCa is selected. All nonselected MCa's maintain the stored information as the potentials on the parasitic capacitances associated with the Aa and Ba nodes.

To write a "0" into a cell rather than read out, the WLa, BLaL, and BLaR of the selected cell are set in potential to 0.2, 1.6 and 0.4 volts, respectively, and all nonselected WLa's and BLaL's and BLaR's are set in potential to 1.0, 0.8, and 0.8 volts, respectively. Vfixa is held at 0.2 volts. This biases on T1a and biases off T2a. As a result there is a cutoff of base current to T3a which ceases to conduct. The potential of node Aa increases until the emitter-base junction of T4a is sufficiently forward biased to conduct between the collector and emitter thereof. T4a continues to conduct until node Ba is dischared to approximately 0.2 volts. Node Aa charges up to a level of above 0.82 volts and stays at that potential level. Only diode current flows thru T4a during the write operation. A standby operation is now instituted which forward biases the emitter-base junctions of T1a and T2a and causes dc current to flow through T2a and T4a. This is the storage of a "0" in the MCa. To write a "1" the potentials of BLaL and BLaR are interchanged. All of the other MCa's of a selected WLa can be simultaneously written into by setting all the bit lines to values corresponding to writing a "1" or a "0". All nonselected cells will hold stored information as a result of effectively being in standby or as the potentials on the parasitic capacitances of the Aa and Ba nodes.

A read or a write operation is followed by a standby operation in order to insure that the potentials of all nodes Aa and Ba are setback to the full levels which define the information stored in the cells.

Resistors (not illustrated) are used in series with the bit lines to limit excessive current flow through the transistors of MCa in the cases where the nominal emitter-base potential is approxiametly 0.9 volts or greater.

MCa can be fabricated in an area of silicon which is only approximately 12% greater than that needed to fabricate a standard IIL memory cell. MCa does not have the stability and bit line offset problems of the standard IIL memory cell and offers faster operations and a better tradeoff between increasing the magnitude of read out signal and power dissipation.

Referring now to FIGS. 7, 8 and 9, there is illustrated a top view, a first cross-sectional view through lines Aa—Aa of FIG. 7, and a second cross-sectional view through line Ba—Ba of FIG. 7. Array 10a is illustrated as being fabricated starting with a p-type silicon substrate 1000a, on top of which is an n+ type layer over which is an epitaxial n− type layer. Each semiconductor region illustrated is denoted as to whether it is of p or n type conductivity. Isolated portions of the n+ type layer and the n− type epitaxial layer are used to form portions of the transistors of a MCb.

An elongated portion of the n− type epitaxial layer, denoted as region 1004a, contains lateral p-n-p transistors T1a and T2a of an illustrative memory cell and of all memory cells of a common row of memory cells. Region 1004a serves as the n− type bases of both T1a and T2a. Spaced apart from each other by n− type or n+ type portions of region 1004a are p+ type regions 1008a, 1010a, 1012a and 1014a. Regions 1008a and 1014a serve as the collector regions of T1a and T2a, respectively. Regions 1010a and 1012a serve as the emitters of T1a and T2a, respectively. Regions 1016a and 1018a are n+ type regions which act to inhibit parasitic transistors from forming between T1a or T2a and any other T1a's and T2a's of memory cells which are in the same row of memory cells as the cell illustrated. Another elongated portion of the epitaxial layer, which is denoted as 1020a, contains transistors T3a and T4a of the illustrated cell and all other T3a's and T4a's of a common row of memory cells. It is isolated from region 1004a by a trench 1022a which extends from a major surface of the substrate down into the p− substrate itself. Typically, on both sides of trench 1022a exists silicon dioxide regions (not illustrated) which extend down to the n+ type layer. Region 1020a includes two p+ regions 1024a and 1026a which are separated by portions of the n+ type layer and which serve as the bases of T3a and T4a. Region 1026a includes therewithin an n+ type region 1028a which serves as the collector of T3a. Region 1024a has included therewithin an n+ type region 1030a which serves as the collector of T4a. T3a comprises n+ emitter region 1028a, p+ base region 1026a and a portion of the n− epitaxial layer which is below the base region 1026a and which contacts the n+ layer and serves as the emitter of T3a. T4a comprises n+ region 1030a, p+ base region 1024a, and a portion of the n-type epitaxial layer which is below the base region 1024a and which contacts the n+ type layer and serves as the emitter of T4a. Thus, the emitters of T3a and T4a are coupled together. Bit lines BLaL and BLaR are coupled to regions 1010a (the emitter of T1a) and 1012a (the emitter of T2a. Elongated region 1004a serves as the word line for the illustrated cell and is coupled to the bases of T1a and T2a, respectively. Elongated region 1020a serves as the common return line for the illustrated cell and also as the emitters of transistors T4a and T3a, respectively. A first conductor C1a couples the collector of T1a (region 1008a) to the base (region 1024a) of T3a and to the collector (region 1028a) of T3a. A second conductor C2a couples the collector of T2a (region 1014a) to the collector of T4a (region 1030a) and to the base of T3a (region 1026a).

Figure 10:
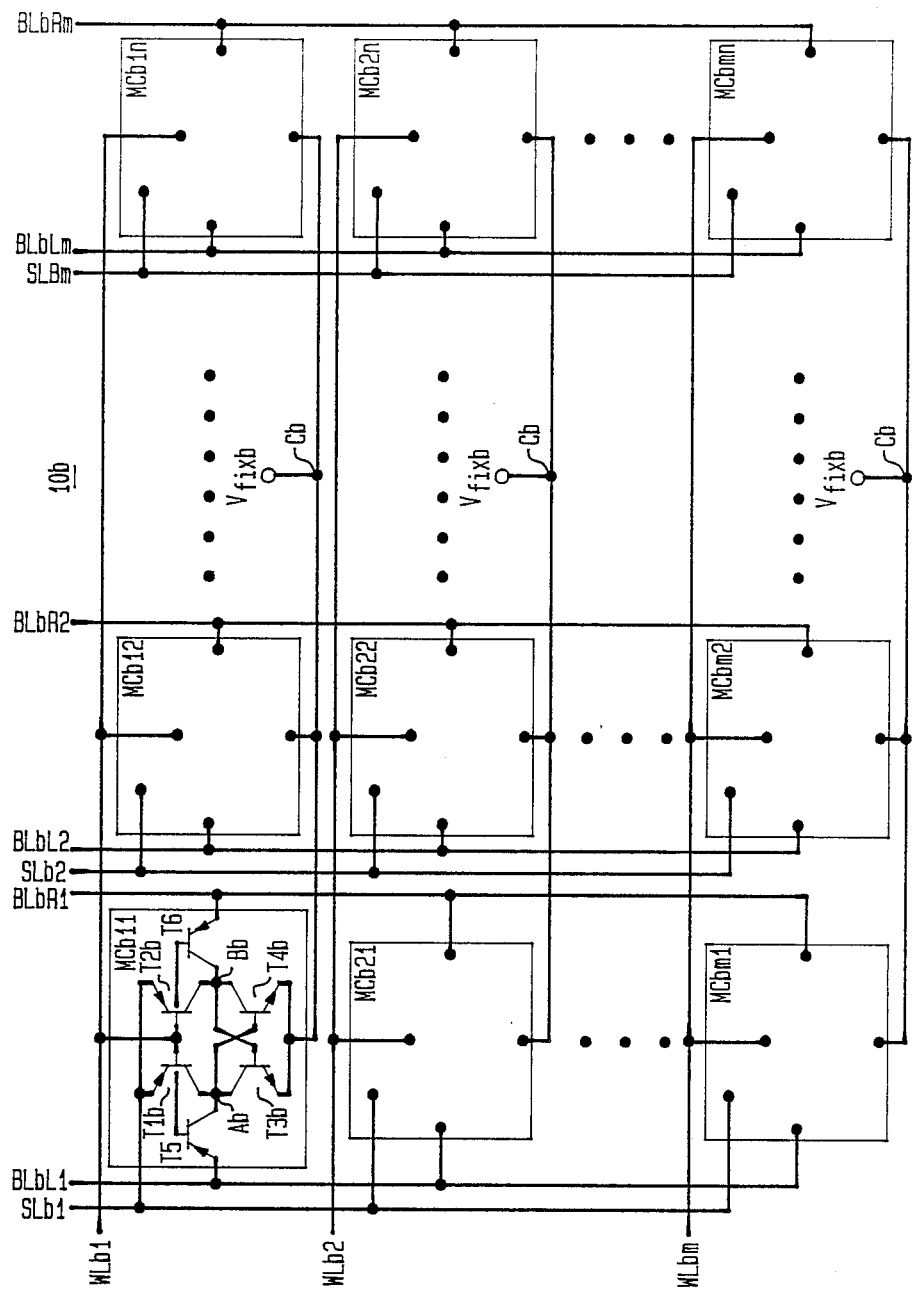
FIG. 10 illustrates a memory array in accordance with still another embodiment of the present invention.

Referring now to FIG. 10, there is illustrated a semiconductor memory array 10b which comprises memory cells MCb arranged in m rows by n columns where m and n are positive intergers. The numbers following the MCb's indicate the location of each memory cell in the array. For example, MCb11 represents a memory cell which is in the first row and in the first column; MCbMN represents a memory cell which is in the mth row and nth column. The array comprises m pairs of bit lines BLb's. Each column of the m columns of memory cells has a separate pair of bit lines BLb's associated therewith. The bit line to the left of a MCb is BLbL and the bit line to the right of a MCb is BLbR. The number following a BLbL or a BLbr indicates which column the BLb's are associated with. For example, the first column of memory cells, MCb11, MCb21, ..., MCbm1, has associated therewith bit lines BLbL1 and BLbR1; the nth column of memory cells, MCb1n, MCb2n, ..., MCbmn, has associated therewith bit lines BLbLn and BLbRn. The array comprises n source lines SLb1, SLb2, ..., SLbn, with one separate source line being associated with each column of 8MCb's. For example, SLb2 is associated with the second column of memory cells which comprises MCb12, MCb22, ..., MCbM2. The array further comprises m word lines WLb1, WLb2, ..., WLbm with a separate word line being associated with each row of MCb's. For example, WLb2 is associated with the second row of memory cells which comprise MCb21, MCb22, ..., MCb2n. Array 10b is useful as a high density random access quasi static memory.

Figure 11:
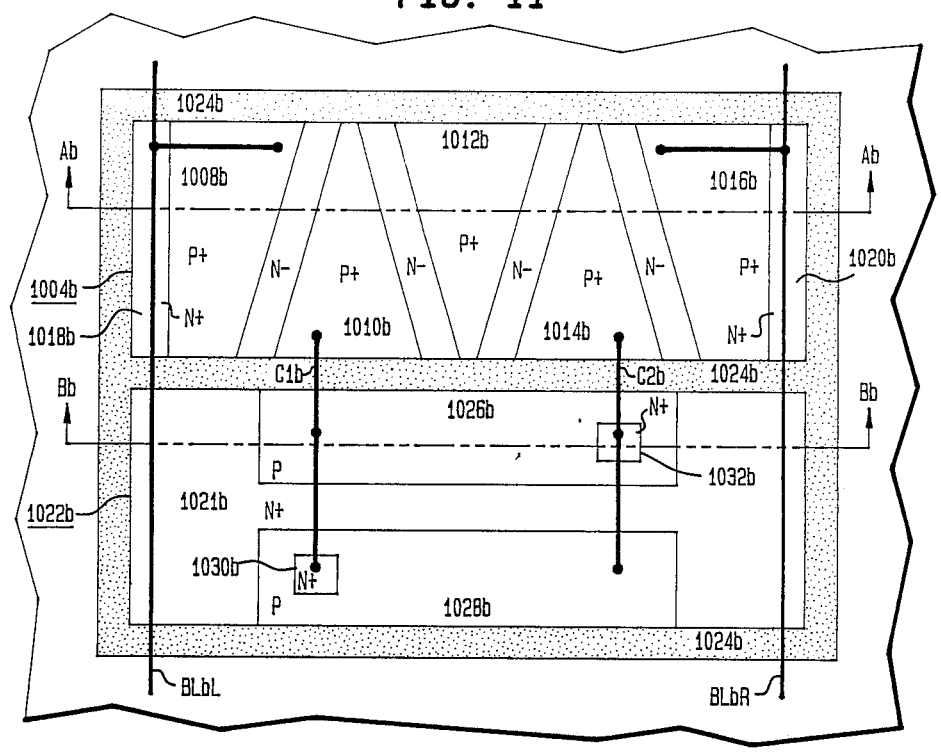
FIG. 11 illustrates a top view of a semiconductor embodiment of the memory array of FIG. 10.
Figure 12:
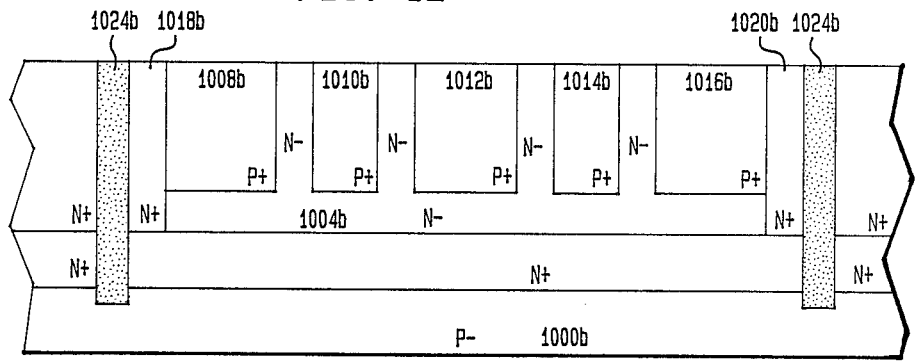
FIG. 12 illustrates a cross-sectional view along line Ab—Ab of FIG. 11.

Each MCb comprises four bipolar transistors of one conductivity type and two bipolar transistors of the opposite conductivity type. In one illustrative example, the transistors of the one conductivity type are assumed to be lateral p-n-p transistors T1b, T2b, T5 and T6, and the transistors of the opposite conductivity type are vertical n-p-n transistors T3b and T4b. The structures of all of the MCb's are identical to that illustrated for MCb11. FIG. 11 illustrates a top view of a MCb of a semiconductor embodiment of part of array 10b fabricated on a single silicon substrate (body). FIGS. 11 and 12 illustrate cross-section views of parts of memory array 10b along lines Ab-Ab and Bb-Bb, respectively, of FIG. 10.

In each MCb the collector of T1b is coupled to the collector of T3b, to the base of T4b, to the collector of T5, and to a node Ab. The collector of T2b is coupled to the collector of T4b, to the base of T3b, to the collector of T5 and to a node Bb. The emitters of T1b and T2b are coupled together to a source line SLb. The emitters of T3b and T4b coupled to a node Cb and to a fixed voltage Vfixb. The emitters of T5 and T6 are coupled to bit lines BLbL and BLbR, respectively. The emitters and collectors of T5 and T6 effectively reverse if the current through T5 and T6 reverses. T3b and T4b have cross-coupled bases and act essentially as a flip-flop. T1b and T2b act as load elements for T3b and T4b, respectively, and as sources of base current for T4b and T3b, respectively. Typically, current flows through T1b and T3b with base current to support conduction through T3b being supplied by T2b, or flows through T2b and T4b with base current to support conduction through T4b being supplied by T1. The cell is to be defined as storing "1" if there is current flow through T1b and T3b and as storing a "0" if there is current flow through T2b and T4.

A cycle of operation starts with a standby portion which is followed by an access (read or write) portion which is in turn followed by a standby portion. In standby, WLb is typically at 1.0 volt and SLb is at 1.6 volts. BLbL and BLbR are both at approximate 0.4 volts and Vfixb=0.2 volts. Assuming the cell stores a "1", then there is current flow through T1b and T3b and T2b acts as a source of base current for T3b. There is a 0.6 volt forward bias across the emitter-base junctions of T1b and T2b and, accordingly, there is enough forward bias across these junctions to allow level conduction through T1b and T2b. Terminal Bb is at approximately +0.82 volts and terminal Ab is at approximately +0.22 volts. T3b is conducting and operating in saturation since its collector, which is at +0.82 volts, is forward biased by 0.60 with respect to its base, which is at +0.22 volts. T1b and T2b are conducting in a linear region since both collector-base junctions are reversed biased. The emitter-base and collector-base junctions of T5 and T6 are all reverse biased and therefore T5 and T6 are not conducting.

During standby the amount of current being drawn by a cell is relatively low and can be cut off relatively easily. The forward current gain (beta) of T3b or T4b when they are operating in saturation is typically not much above unity. Accordingly, less than but close to half of the current flowing through the MCb flows through T2b when the cell stores a "1". An alpha particle hitting terminal Bb causes the generation of electron-hole pairs which decrease the potential of terminal Bb from +0.82 towards the 0.2 volts on Vfixb. This has the effect of quickly and significantly reducing the forward bias across the emitter-base junction of T3b. This could thus result in no conduction through T3b and T4b for some short period of time. T2b, which is operating in a linear region, acts as a fast responding current source and quickly re-establishes the potential of terminal Ab so as to prevent T3b from turning off. Accordingly, the memory cell has relatively good stability with respect to alpha particles. If T2b were to operate during standby in saturation, as is the case with the load injector p-n-p's of standard IIL memory cells, it would be a relatively slow responding current source which may not always act quickly enough to keep T3b conducting and thus save the correct stored information in the memory cell.

The standard IIL memory cell, which is discussed in the Background of the Invention hereinabove, achieves its modest size by merging a lateral p-n-p transistor with a vertical n-p-n transistor through the use of a common n− type region for the bases of the p-n-p's and the emitters of the n-p-n's. This forces the equivalent T2b p-n-p transistor to operate in saturation during standby and thereby creates significant stability problems. This memory cell of the present invention can be fabricated in approximately the same area of silicon as the standard IIL memory cell but does not couple the bases of the p-n-p's to the emitters of the n-p-n's and thus allows the p-n-p's to operate in a linear region during standby which improves stability.

One or up to all of the MCb's of a given row of MCb's can be accessed (read or written) at the same time. Assume first that only one MCb is to be read. The SLb and WLb of this cell are changed in potential to +1.1 volts and +0.2 volts, respectively. All other SLb's and WLb's are set to 0.4 volts and +1.0 volts, respectively. The same basic conditions as existed during standby with respect to T1b, T12b, T3b, and T4b still exist except that the emitter-base junctions of T1b and T2b are heavily forward biased (+0.9 volts) whereas same were just lightly forward biased (+0.6 volts) during standby. This results in substantially greater current flow through T1b and T3b and substantially more base current through T2b to support conduction through T3. Node Bb is charged up above +0.82 volts, the base of T6 is at +0.2 volts, and the emitter of T6 is at approximately +0.4 volts. This forward biases the collector-base junction of T6 by more than 0.6 volts while the emitter-base junction is forward biased by only approximately +0.2 volts. The emitter and collector of T6 reverse such that positive current flows from node Bb to BLbR through T6. The emitter-base junction of T5 is only forward biased by approximately +0.2 volts and the collector-base junction of T5 is reversed by approximately +0.1 volts. Thus T5 is biased off. The conduction on BLbR is sensed and is indicative of a "1" being stored in the MCb. If a "0" is being stored then T5 becomes biased on in the reverse direction and current flow therethrough and T6 is biased off.

If it is desired to read all of the MCb's of a selected word line then all SLb's are set to 1.1 volts, the selected WLb's set to 0.2 volts, and all BLbL's and BLbR's are allowed to assume potentials between approximately 0.4 and 0.45 volts.

To write a "0" into a MCb, the WLb and SLb of the cell are set to 0.2 and 0.4 volts, respectively, and the BLbL and BLbR are set to 1.1 and 0.4 volts, respectively. This biases on T5 and causes current to flow in the reverse direction to normal flow such that node Ab is set to above +0.82 volts and T4 is biased on and starts to conduct. T6 is biased off and therefore has no effect on the potential of node Bb. To write a "1", BLbL and BLbR are set to +0.4, and 1.1 volts, respectively. This biases on T6 and T3 and both conduct.

The memory array 10b of FIG. 10 can be made fully static by rotating the select lines SLb's by 90 degrees such that same are parallel to the word lines WLb's. There are now needed m SLb's instead of the n SLb's previously needed. These horizontal SLb's (not illustrated) are coupled to the emitters of T1b and T2b of each MCb of a common row. During a standby operation this modified array acts essentially as the original. During an access operation all MCb's of a selected WL and SL are activated and all other MCb's are operating as would occur during normal standby operation. Thus with horizontal SLb's, array 10b becomes fully static and there is essentially no need for a standby operation. Access times may be as long as desired. There are disadvantages incurred with horizontal SL's. The overall array layout is somewhat more complex and therefore it is expected its size will be greater than with vertical SLb's. Further, there may be current hogging by some of the emitter-base junctions of the T1b's and T2b's of the memory cells of the activated (accessed) row.

Figure 13:
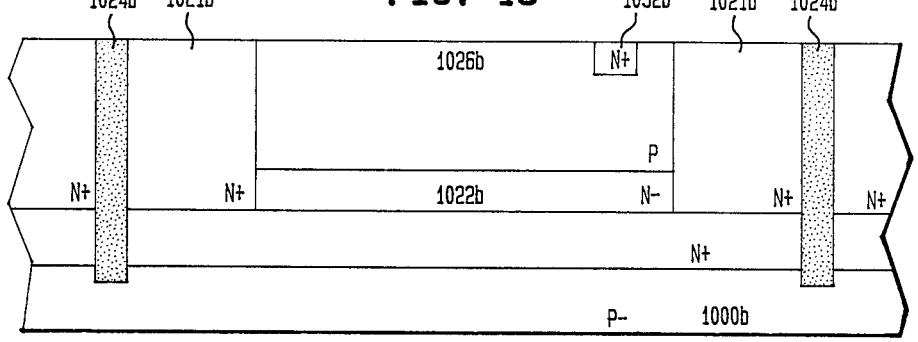
FIG. 13 illustrates a cross-sectional view along line Bb—Bb of FIG. 11.

Referring now to FIGS. 11, 12 and 13, there is illustrated a top view, a first cross-sectional view through lines Ab—Ab of FIG. 11, and a second cross-sectional view through line Bb—Bb of FIG. 11. Array 10b is illustrated as being fabricated starting with a p− type silicon substrate 1000b, on top of which is formed an n+ type layer over which is an epitaxial n− type layer. Isolated portions of the n+ type and the n− type epitaxial layer are used to form portions of the transistors of a MCb. Each semiconductor region illustrated is denoted as to whether it is p or n type conductivity.

An elongated portion of the n− type epitaxial layer, denoted as region 1004b, contains lateral p-n-p transistors T1b, T2b, T5, and T6 of the memory cell and all of the memory cells of a common row of memory cells of FIG. 10. Region 1004b serves as the n− type bases of T1b, T2b, T5 and T6. Spaced apart from each other by n− type portions of region 1004b are p+ type regions 1008b, 1010b, 1012b, 1014b and 1016b. Regions 1010b and 1014b serve as the collector regions of T1b and T2b, respectively. Region 1012b serves as emitter of T1b and T2b, respectively. The regions 1008b and 1016b serve as the emitters of transistors T5 and T6, respectively and are coupled to bit lines BLL and BLR, respectively. Region 1004a separates the five p+ type regions, is part of the n− type epitaxial layer and serves as a word line WLa and as the common base region of T1b, T2b, T5 and T6. Region 1018b (to the left of region 1008b) and region 1020b (to the right of region 1016b) are n+ type regions which act to inhibit parasitic transistors from forming between T5 and T6 and between any other T5's and T6's (not illustrated) of memory cells which are in the same row of memory cells as the one illustrated.

Another elongated portion of the n− type epitaxial layer, which is denoted as 1022b, contains transistors T3b and T4b of the illustrated cell and all other T3b's and T4b's (not illustrated) of a common row of memory cells. It is isolated from region 1004a by a trench 1024b which extends from a major surface of the substrate down into the p− substrate itself and surrounds regions 1004b and 1022b. Typically, on both sides of trench 1024b exists silicon dioxide regions (not illustrated) which extend down to the n+ type layer. Region 1022b includes two p+ regions 1026b and 1028b which are separated by portions of n+ type region 1021 and which serve as the bases of T4b and T3b, respectively. Region 1021 acts to inhibit parasitic transistors from forming between T3b and T4b and between other T3b's and T4b's(not illustrated) of memory cells which are in the same row of memory cells as the one illustrated. Region 1024b includes therewithin an n+ type region 1030b which serves as the collector of T4b. Region 1028b has included therewithin an n+ type region 1032b which serves as the collector of T3b. T3b comprises n+ type collector region 1030b, p+ base region 1028b and a portion of the n− epitaxial layer which is below the base region 1028b and which contacts the n+ layer and serves as the common emitter of T3b and T4b. T4b comprises n+ region 1032b, p+ base region 1026b, and a portion of the n− type epitaxial layer which is below the base region 1026b and which contacts the n+ type layer and serves as the emitters of T4b and T3b. Thus, the emitters of T3b and T4b are coupled together. Elongated region 1022b serves as the common return line and emitters of T3b and T4b. A first conductor C1b couples the collector of T1b (region 1010b) to the base (region 1026b) of T4b and to the collector (region 1030b) of T3b. A second conductor C2b couples the collector of T2b (region 1014b) to the collector of T4b (region 1032b) and to the base of T3b (region 1028b).

MCb can be fabricated in a silicon area which is approxiametly 35% greater than the standard IIL memeory cell. It is more stable and provides faster operation than the standard IIL memory cell while not having the bit offset problem and offering a better tradeoff between increased magnitude of read out current and power dissipation.

The embodiments described herein are intended to be illustrative of the general principles of the invention. Various modifications are possible consistent with the spirit of the invention. For example, dielectric isolation or junction isolation could be substituted for the trench isolation. Still further, the arrays could be fabricated in and/or on gallium arsenide. Still further, some of the interconnections of MCa and MCb could be made of layers of electrically conductive polysilicon. Still further, T3a, T3b, T4a, and T4b could be vertical polysilicon base type vertical bipolar transistors.

What is claimed is:

1. A semiconductor random access memory array comprising:
    a plurality of memory cells which each comprise first and second transistors of one conductivity type and third and fourth transistors of the opposite conductivity type, each transistor having an emitter, a base, and a collector;
    a word line coupled to the bases of the first and second transistors;
    first and second bit lines coupled to the emitters of the third and fourth transistors, respectively;
    a source line coupled to the emitters of the first and second transistors, respectively;
    first connection means for connecting the collector of the first transistor and the base of the third transistor;

second connection means for connecting the base of the fourth transistor to the collector of the third transistor;

third connection means for connecting the collector of the second transistor and the base of the fourth transistor;

fourth connection means for connecting the base of the third transistor to the collector of the fourth transistor;

the word line and the bases of the first and second transistors are commonly provided by a first semiconductor region of the first conductivity type which exists within a semiconductor body;

the emitter of the third transistor existing within a second semiconductor region of the first conductivity type within the semiconductor body;

the emitter of the fourth transistor existing within a third semiconductor region of the first conductivity type within the semiconductor body;

the first, second, and third semiconductor regions being electrically isolated from each other.

2. The array of claim 1 wherein:

the first semiconductor region, which is of the first conductivity type, contains three separate semiconductor regions of the opposite conductivity type with each being separated from the other by portions of the first region;

the second semiconductor region, which is of the first conductivity type, contains therewithin a separate semiconductor region of the opposite conductivity type, the separate semiconductor region within the second semiconductor region having a separate semiconductor region of the first conductivity type included therewithin; and the third semiconductor region, which is of the first conductivity type, contains therewithin a separate semiconductor region of the opposite conductivity type, the semiconductor region within the third semiconductor region having a separate semiconductor region of the first conductivity type included therewithin.

3. The array of claim 2 wherein:

the first, second, and third regions are electrically isolated from each other by an isolation trench which is filled with material being selected from a group comprised of polysilicon or polyimide;

the first and third connection means each comprise a separate electrically conductive polysilicon layer;

the second and fourth connection means each comprise a metallic conductor; and the third and fourth transistors are each separate vertical polysilicon base type bipolar transistor.

4. The array of claim 3 wherein the first conductivity type is n-type and the opposite conductivity type is p-type.

5. The array of claim 4 wherein the semiconductor body is of p-type conductivity.

6. A random access memory array formed in and/or on a semiconductor body comprising:

a plurality of memory cells which each comprise first and second transistors of one conductivity type and third and fourth transistors of the opposite conductivity type, each transistor having an emitter, a base, and a collector;

a word line coupled to the bases of the first and second transistors;

first and second bit lines coupled to the emitters of the first and second transistors, respectively;

a common line coupled to the emitters of the third and fourth transistors;

first connection means for connecting the collectors of the first and third transistors and the base of the third transistor;

second connection means for connecting the collectors of the second and fourth transistors and the base of the fourth transistor;

the word line and the bases of the first and second transistors are commonly provided by a first semiconductor region of the first conductivity type which exists within the semiconductor body;

the common line and the emitters for the third and fourth transistors are commonly provided by a second semiconductor region of the first conductivity type which exists within the semiconductor body; and the first and second regions are electrically isolated from each other.

7. The array of claim 6 wherein:

the first semiconductor region, which is of the first conductivity type, contains three separate semiconductor regions of the opposite conductivity type with each being separated from the other by portions of the first region; and the second semiconductor region, which is of the first conductivity type, contains two separate semiconductor regions of the opposite conductivity type with each being separated from each other by portions of the second regions, each of the two separate semiconductor regions having a separate semiconductor region of the first conductivity type included therewithin.

8. The array of claim 7 wherein the first and second regions are electrically isolated from each other by an isolation trench which is filled with material being selected from a group comprised of polysilicon or polyimide.

9. The array of claim 8 wherein the first conductivity type is n-type and the opposite conductivity type is p-type.

10. The array of claim 9 wherein the semiconductor body is of p-type conductivity.

11. A semiconductor array random access memory comprising:

a plurality of memory cells which each comprise first, second, fifth and sixth transistors of a first conductivity type and third and fourth transistors of the opposite conductivity type, each transistor having an emitter, a base, and a collector;

a source line coupled to the emitters of the first and second transistors;

a common line coupled to the emitters of the third and fourth transistors;

a word line coupled to the base of the first, second, fifth and sixth transistors;

first and second bit lines coupled to the emitters of the fifth and sixth transistors, respectively;

first connection means for connecting the collectors of the first, third, and fifth transistors and the base of the fourth transistor;

second connection means for connecting the collectors of the second, fourth and sixth transistors and the base of the third transistor;

the word line and the bases of the first, second, fifth and sixth transistors are commonly provided by a first semiconductor region within the semiconductor body; and the common line and the emitters of the third and fourth transistors are commonly provided by a second semiconductor region within the semiconductor body;

the first and second semiconductor regions are electrically isolated from each other.

12. The array of claim 11 wherein:

the first semiconductor region, which is of the first conductivity type, contains five separate semiconductor regions of the opposite conductivity type with each being separated from the other by portions of the first region; and the second semiconductor region, which is of the first conductivity type, contains two separate semiconductor regions of the opposite conductivity type with each being separated from the other by portions of the second region, each of the two separate semiconductor regions having a separate semiconductor region of the first conductivity type included therewithin.

13. The array of claim 12 wherein the first and second regions are electrically isolated from each other by an isolation trench which is filled with material being selected from a group comprised of polysilicon or polyimide.

14. The array of claim 13 wherein the first conductivity type is n-type and the opposite conductivity type is p-type.

15. The array of claim 14 wherein the semiconductor body is of p-type conductivity.

16. A read/write random access mxn memory array fabricated in a semiconductor body comprsing:

an mxn array of memory cells, where m and n are respectively positive intergers, and said mxn array of memory cells has m rows and n columns whereby each of said n columns includes m memory cells and each of said m rows includes n memory cells;

n source lines, each of said n source lines being associated with a discrete one of said n columns of memory cells;

n pairs of bit lines, each pair of bit lines including a first bit line and a second bit line, each pair of bit lines being associated with a discrete one of said n columns of memory cells;

m word lines, each of said m word lines being associated with a discrete one of said m rows of memory cells;

selection means responsive to receipt of a storage address contained in said read/write random access memory array, said selection means for selecting a word line, a source line at least one of said n pairs of bit lines;

controllable read/write circuit means, said controllable read/write circuit means cooperating with at least one pair of said n pairs of bit lines and with said selection means for reading or writing data into, or from at least one or more of said memory cells of said row of memory cells selected by said memory address; and, each of said memory cells comprising:

first, second, third and fourth transistors, said first and second transistors having a common emitter and a common base, said first and second transistors each having a collector, said third and fourth transistors each having an emitter, base and collector, said first and second transistors being of a first conductivity type, said third and fourth transistors being of a second conductivity type, and said first and second conductivity types being opposite one to the other;

said common emitter of said first and second transistors being connected to the source line associated with the memory cell;

said common base of said first and second transistors being connected to the word line associated with the memory cell;

said emitter of said third transistor being connected to said first bit line of said bit line pair associated with the memory cell;

said emitter of said fourth transistor being connected to said second bit line of said bit line pair associated with the memory cell;

first connection means, said first connection means connecting in common said collector of said first transistor and said base of said fourth transistor;

second connection means, said second connection means connecting in common the collector of the third transistor and the base of the fourth transistor;

third connection means, said third connection means connecting in common said collector of said second transistor and said base of said third transistor;

fourth connection means, said fourth connection means connecting in common the collector of the fourth transistor and the base of the third transistor;

each of said m word lines is provided in a discrete elongated first semiconductor region of said second conductivity type contained within the semiconductor body, wherein each of said first and second transistors of each of said n memory cells associated with said word line is formed in said discrete elongated first semiconductor region corresponding to said word line; and said first and second transistors of each memory cell of said row corresponding to said word line is provided by first, second and third pockets of first conductivity semiconductor regions formed in said elongated first semiconductor region of said word line;

a second semiconductor region of the second conductivity type, the third transistor being formed in the second semiconductor region;

a third semiconductor region of the second conductivity type, the fourth transistor being formed in the third semiconductor region; and the first, second and third regions being electrically isolated from each other.

17. The array of claim 16 wherein:

the first, second and third regions being electrically isolated from each other by an isolation trench containing material being selected from the group comprised of polysilicon or polyimide;

the first and third connection means each comprise a separate layer of electrically conductive polysilicon;

the second and fourth connection means each comprise a separate metallic conductor; and the first and second transistors are each lateral p-n-p transistors and the third and fourth transistors are each vertical n-p-n polysilicon base bipolar transistors.

18. A read/write random access mxn memory array fabricated in a semiconductor body comprising:

an mxn array of memory cells, where m and n are respectively positive intergers, and said mxn array of memory cells has m rows and n columns whereby each of said n columns includes m memory cells and each of said m rows includes n memory cells;

m common lines, each of said m common lines being associated with a discrete one of said m rows of memory cells;

n pairs of bit lines, each pair of bit lines including a first bit line and a second bit line, each pair of bit lines being associated with a discrete one of said n columns of memory cells;

m word lines, each of said m word lines being associated with a discrete one of said m rows of memory cells;

selection means responsive to receipt of a storage address contained in said read/write random access memory array, said selection means for selecting a word line, a source line, and at least one of said n pairs of bit lines;

controllable read/write circuit means, said controllable read/write circuit means, said controllable read/write circuit means cooperating with at least one pair of said n pairs of bit lines and with said selection means for reading or writing data into, or from at least one or more of said memory cells of said row of memory cells selected by said memory address;

each of said memory cells comprising:

first, second, third and fourth transistors, said first and second transistors having separate emitters and a common base, said first and second transistors each having a collector, said third and fourth transistors having a common emitter, each having a base and collector, said first and second transistors being of a first conductivity type, said third and fourth transistors being of a second conductivity type, said first and second conductivity types being opposite one to the other;

said common emitter of said third and fourth transistors being connected to the common line associated with the memory cell;

said common base of said first and second transistors being connected to the word line associated with the memory cell;

said emitter of said first transistor being connected to said first bit line of said bit line pair associated with the memory cell;

said emitter of said second transistor being connected to said second bit line of said bit line pair associated with the memory cell;

first connection means, said first connection means connecting in common said collector of said first transistor said collector of said third transistor and said base of said fourth transistor; and second connection means, said second connection means connecting in common said collector of said second transistor, said collector of said fourth transistor and said base of said third transistor;

each of said m word lines is provided in a discrete elongated first semiconductor region of said second conductivity type contained within the semiconductor body, wherein each of said first and second transistors of each of said n memory cells associated with said word line is formed in said discrete elongated first semiconductor region corresponding to said word line is provided by first, second and third pockets of first conductivity semiconductor regions formed in said discrete elongated semiconductor region of said word line; and each of said m common lines is provided in a discrete elongated second semiconductor region of the second conductivity type contained within the semiconductor body, wherein each of the third and fourth transistors of each of said n memory cells associated with said common line is formed in said second semiconductor region.

19. The array of claim 18 wherein the first and second regions being electrically isolated from each other by an isolation trench containing material being selected from the group comprised of polysilicon or polyimyide.

20. A read/write random access mxn memory array fabricated in a semiconductor body comprising:

an mxn array of memory cells, where m and n are respectively positive intergers, and said mxn array of memory cells has m rows and n columns whereby each of said n columns includes m memory cells and each of said m rows includes n memory cells;

n source lines, each of said n source lines being associated with a discrete one of said n columns of memory cells;

n pairs of bit lines, each pair of bit lines including a first bit line and a second bit line, each pair of bit lines being associated with a discrete one of said n columns of memory cells;

m word lines, each of said m word lines being associated with a discrete one of said m rows of memory cells;

selection means responsive to receipt of a storage address contained in said read/write random access memory array, said selection means for selecting a word line, a source line, and at least one of said n pairs of bit lines;

controllable read/write circuit means, said controllable read/write circuit means cooperating with at least one pair of said n pairs of bit lines and with said selection means for reading or writing data into, or from at least one or more of said memory cells of said row of memory cells selected by said memory address;

each of said memory cells comprising:

first, second, third, fourth, fifth and sixth transistors, said first and second transistors having a common emitter, said first, second, fifth and sixth transistors having a common base, said first and second transistors each having a collector, said third and fourth trransistor each having an emitter, base and collector, said first, second, fifth and sixth transistors being of a first conductivity type, said third and fourth transistors being of a second conductivity type, and said first and second conductivity types being opposite one to the other;

said common emitter of said first and second transistors being connected to the source line associated with the memory cell;

said common base of said first and second transistors being connected to the word line associated with the memory cell;

said emitter of said fifth transistor being connected to said first bit line of said bit line pair associated with the memory cell;

said emitter of said sixth transistor being connected to said second bit line of said bit line pair associated with the memory cell;

first connection means, said first connection means connecting in common said collectors of said first, third and fifth transistors and said base of said third transistor; and second connection means, said second conection means connecting in common said collectors of said second, fourth and sixth transistors, said collector of said fourth transistor and said base of said third transistor;

each of said m word lines is provided in a discrete elongated first semiconductor region of said second conductivity type contained within the semiconductor body, wherein each of said first, second fifth and sixth transistors of each of said n memory cells associated with said word line is formed in said discrete elongated first semiconductor region corresponding to said word line and wherein said first, second, fifth and sixth transistors of each memory cell of said row corresponding to said word line is provided by first, second, third, fourth and fifth pockets of first conductivity semiconductor regions formed in said discrete elongated first semiconductor region of said word line; and each of said m common lines is provided in a discrete elongated second semiconductor region of the second conductivity type contained within the semiconductor body, wherein each of the third and fourth transistors of each of said n memory cells associated with said common line is formed in said second semiconductor region.

21. The array of claim 20 wherein the first and second regions being electrically isolated from each other by an isolation trench containing material being selected from the group comprised of polysilicon or polyimide.

* * * * *